United States Patent
Fang et al.

(10) Patent No.: US 7,046,058 B1
(45) Date of Patent: May 16, 2006

(54) DELAYED-LOCKED LOOP WITH FINE AND COARSE CONTROL USING CASCADED PHASE INTERPOLATOR AND VARIABLE DELAY CIRCUIT

(75) Inventors: Al Fang, Suwanee, GA (US); Mike Farrell, Atlanta, GA (US); Brian Butka, Alpharetta, GA (US)

(73) Assignee: Integrated Device Technology, Ltd., San Jose, CA (US)

( * ) Notice: Subject to any disclaimer, the term of this patent is extended or adjusted under 35 U.S.C. 154(b) by 84 days.

(21) Appl. No.: 10/671,305

(22) Filed: Sep. 24, 2003

(51) Int. Cl.
    *H03L 7/06* (2006.01)
(52) U.S. Cl. ..................... 327/158; 327/161
(58) Field of Classification Search ............... 327/156, 327/158, 159, 160, 161, 162, 149, 150, 151, 327/153
    See application file for complete search history.

(56) References Cited

U.S. PATENT DOCUMENTS

| | | | | |
|---|---|---|---|---|
| 5,485,490 | A | | 1/1996 | Leung et al. ............... 375/371 |
| 5,544,203 | A | * | 8/1996 | Casasanta et al. .......... 375/376 |
| 5,604,775 | A | * | 2/1997 | Saitoh et al. ............... 375/376 |
| 5,614,855 | A | | 3/1997 | Lee et al. ................... 327/158 |
| 6,125,157 | A | | 9/2000 | Donnelly et al. ........... 375/371 |
| 6,212,126 | B1 | * | 4/2001 | Sakamoto ................... 365/233 |
| 6,281,726 | B1 | * | 8/2001 | Miller, Jr. ................... 327/156 |
| 6,539,072 | B1 | | 3/2003 | Donnelly et al. ........... 375/371 |
| 6,836,166 | B1 | * | 12/2004 | Lin et al. ................... 327/158 |
| 2002/0015338 | A1 | * | 2/2002 | Lee ............................. 365/200 |
| 2002/0172314 | A1 | * | 11/2002 | Lin et al. ................... 375/376 |
| 2002/0180501 | A1 | * | 12/2002 | Baker et al. ............... 327/158 |
| 2003/0030473 | A1 | * | 2/2003 | Lee ............................. 327/158 |
| 2003/0085747 | A1 | * | 5/2003 | Hein et al. ................... 327/269 |
| 2003/0167417 | A1 | * | 9/2003 | To et al. ..................... 713/500 |
| 2003/0182335 | A1 | * | 9/2003 | Conway et al. ............. 708/290 |
| 2004/0066873 | A1 | * | 4/2004 | Cho et al. ................... 375/376 |
| 2004/0158757 | A1 | * | 8/2004 | Lin ............................. 713/401 |

OTHER PUBLICATIONS

Lee et al., "A 2.5 V CMOS Delay-Locked Loop for an 18 Mbit, 500 Megabyte/s DRAM," IEEE Journal of Solid-State Circuits, vol. 29, No. 12, Dec. 1994, pp. 1491-1496.
Pixel-Flow System Documentation, Rev. 0006.0, Chapter IV.9 Clock Input Buffer and Delay-Locked Loop (Jan. 23, 2001).

(Continued)

*Primary Examiner*—Tuan T. Lam
(74) *Attorney, Agent, or Firm*—Myers Bigel Sibley & Sajovec PA (57) ABSTRACT

A delay-locked loop (DLL) circuit includes a phase interpolator circuit and variable delay circuit coupled in cascade and operative to generate an output clock signal that is delayed with respect to a reference clock signal responsive to respective first and second control signals applied to the phase interpolator and the variable delay circuit. The DLL circuit further includes a phase control circuit that generates the first and second control signals responsive to the output clock signal and the reference clock signal. The variable delay circuit may provide a coarser resolution than the phase interpolator circuit, for example, the variable delay circuit may include a tapped delay chain circuit configured to provide step changes in delay responsive to the second control signal. The phase control circuit may be operative to cause the phase interpolator circuit to shift from one extreme of a delay range thereof towards another extreme of the delay range concurrent with a step change in delay through the variable delay circuit to thereby limit overcompensation.

18 Claims, 4 Drawing Sheets

OTHER PUBLICATIONS

Efendovich et al., "Multifrequency Zero-Jitter Delay-Locked Loop," IEEE Journal of Solid-State Circuits, vol. 29, No. 1, Jan. 1994, pp. 67-70.

Bazes, Mel, "An Interpolating Clock Synthesizer," IEEE Journal of Solid-State Circuits, vol. 31, No. 9, Sep. 1996, pp. 1295-1301.

Lin et al., "A Register-Controlled Symmetrical DLL for Double-Data-Rate DRAM," IEEE Journal of Solid-State Circuits, vol. 34, No. 4, Apr. 1999, pp. 565-568.

Garlepp et al, "A Portable Digital DLL for High-Speed CMOS Interface Circuits," IEEE Journal of Solid-State Circuits, vol. 34, No. 5, May 1999, pp. 632-644.

Maneatis et al., "Precise Delay Generation Using Coupled Oscillators," IEEE Journal of Solid-State Circuits, vol. 28, No. 12, Dec. 1993, pp. 1273-1282.

Sidiropoulos et al., "A Semidigital Dual Delay-Locked Loop," IEEE Journal of Solid-State Circuits, vol. 32, No. 11, Nov. 1997, pp. 1683-1692.

Sidiropoulos et al., "SA 20.2: A Semi-Digital DLL with Unlimited Phase Shift Capability and 0.08-400MHz Operating Range," 1997 IEEE International Solid-State Circuits Conference Proceedings, 10 pages.

* cited by examiner

DELAYED-LOCKED LOOP WITH FINE AND COARSE CONTROL USING CASCADED PHASE INTERPOLATOR AND VARIABLE DELAY CIRCUIT

BACKGROUND OF THE INVENTION

The present invention relates to clock generation circuits for integrated circuit devices, and more particularly, to delay locked loop (DLL) circuits.

As the processing speed of electronic systems has increased, there has been increased focus on high-speed inter-chip signaling. High-speed inter-chip communication often requires precise clock signals for clocking data signals, and is often desirable that such clock signals provide such precision over a wide range of clock frequencies. Phase-locked loop (PLL) or DLL circuits are commonly used to produce such precision clock signals.

Some conventional DLL circuits use phase interpolators to provide fine phase adjustment of clock signals. For example, in some conventional approaches, a first DLL loop is used to create a plurality of quadrature clock signals. A selected pair of these quadrature clock signals is then applied to a phase interpolator loop, which generates a clock with a phase that is interpolated between the selected quadrature clocks. An exemplary dual-loop DLL circuit along these lines is described in an article by Sidiropolous and Horowitz et al. entitled "A Semi-Digital Dual Delay-Locked Loop," IEEE Journal of Solid-State Circuits, vol. 32, no. 11 (November 1997). Other dual loop circuits are described in "Pixel-Flow System Documentation: IV.9 Clock Input Buffer and Delay-Locked Loop," University of North Carolina, rev. 6.0 (Jan. 23, 2001), available on the World Wide Web at www.cs.unc.edu/~msl/PadLibrary/IV.9.pdf.

Although these and other prior art DLL circuits can provide precision clock control, there is an ongoing need for DLL circuits that can provide precision phase control and wide operating range.

SUMMARY OF THE INVENTION

According to some embodiments of the present invention, a delay-locked loop (DLL) circuit comprises a phase interpolator circuit and variable delay circuit coupled in cascade and operative to generate an output clock signal that is delayed with respect to a reference clock signal responsive to respective first and second control signals applied to the phase interpolator and the variable delay circuit. The DLL circuit further comprises a phase control circuit that generates the first and second control signals responsive to the output clock signal and the reference clock signal.

The variable delay circuit may provide a coarser resolution than the phase interpolator circuit. For example, the variable delay circuit may comprise a tapped delay chain circuit configured to provide step changes in delay responsive to the second control signal. In particular, the tapped delay chain circuit may comprise a plurality of delay circuits interconnected by a switching circuit that is operative to selectively bypass one or more of the delay circuits responsive to the second control signal. The phase control circuit may be operative to cause the phase interpolator circuit to shift between extremes of its delay range concurrent with a step change in delay through the variable delay circuit.

According to further embodiments of the present invention, the phase interpolator circuit comprises first and second delay circuit coupled in series and generating respective first and second delayed clock signals, and a phase interpolator (e.g., analog or digital) that receives the first and second delayed clock circuits and that generates a phase interpolated clock signal therefrom.

In additional embodiments of the present invention, the phase control circuit comprises a phase detector that generates an error signal responsive to a comparison of the reference clock signal to the output clock signal, and a delay control circuit that generates the first and second control signals responsive to the error signal. The delay control circuit may comprise a fine control counter circuit that increments and decrements a fine control count signal responsive to the error signal and that generates a count limit indicator signal responsive to the fine control count signal reaching one of a maximum or minimum count, and a coarse control counter circuit that increments and decrements a coarse control count signal responsive to the error signal subject to the count limit indicator signal. The phase interpolator circuit may be responsive to the fine control count signal, and the variable delay circuit may be responsive to the coarse control count signal. In further embodiments, the coarse control counter circuit is enabled responsive to assertion of the count limit indicator signals. The error signal may comprise first and second error signals, and the fine and coarse control counter circuits may increment and decrement responsive to respective ones of the first and second error signals.

According to further aspects of the present invention, a DLL circuit includes a cascade combination of a phase interpolator circuit and a tapped delay chain circuit. The cascade combination is operative to produce an output clock signal that is delayed with respect to a reference clock signal responsive to a control input. A phase control circuit generates the control input responsive to a comparison of the output clock signal to the reference clock signal. The phase interpolator circuit may be configured to provide a fine delay adjustment and the tapped delay chain may be configured to provide a coarse delay adjustment. The tapped delay chain circuit may comprise a cascade of selectively bypassable fixed delay circuits. A resolution of the tapped delay chain circuit may be substantially the same as a range of the phase interpolator circuit.

Related methods of operating a DLL are also described.

DETAILED DESCRIPTION OF EXEMPLARY EMBODIMENTS

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, like numbers refer to like elements. It will be understood that when an element is referred to as being "connected" or "coupled" to another element, it can be directly connected or coupled to the other element or intervening elements may be present.

Figure 1:
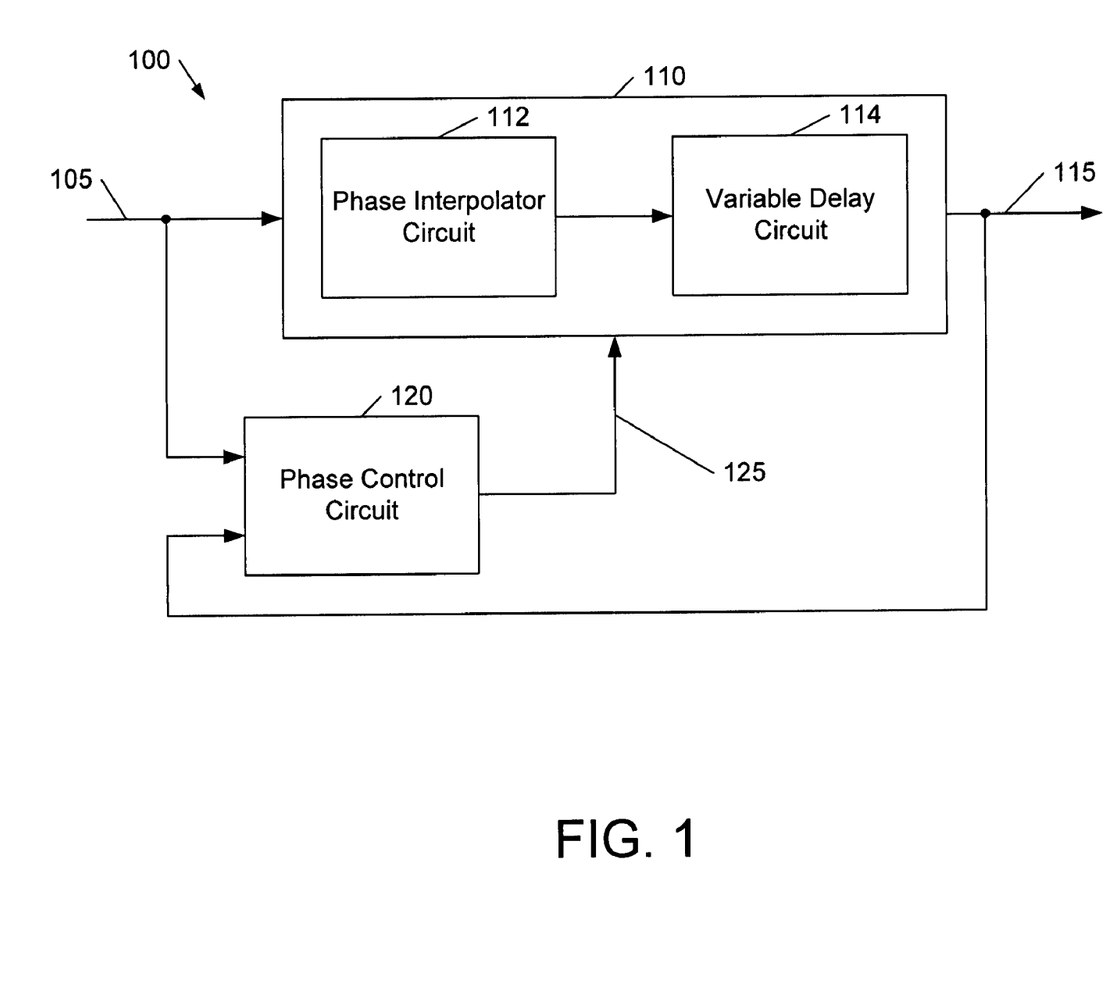
FIG. 1 is a schematic diagram of a DLL circuit according to some embodiments of the present invention.

FIG. 1 illustrates a DLL circuit 100 according to some embodiments of the present invention. The DLL circuit 100 has a single closed loop architecture having a forward path including a cascaded combination 110 of a phase interpolator circuit 112 and a variable delay circuit 114. The cascaded combination 110 produces an output clock signal 115 that is variably delayed with respect to a reference clock signal 105 responsive to a control input 125 produced by a phase control circuit 120. For example, the phase control circuit 120 may generate the control input 125 responsive to a comparison of the output clock signal 115 to the reference clock signal 105.

According to some embodiments of the present invention, the phase interpolator 112 is configured to provide fine delay control for the output clock signal 115, while the variable delay circuit 114 is configured to provide a coarse delay control for the output clock signal 115. It will be appreciated that the phase interpolator circuit 112 and the variable delay circuit 114 can be arranged in reverse order to that shown in FIG. 1, i.e., the variable delay circuit 114 may precede the phase interpolator circuit 112 in the cascade combination 110.

According to some embodiments of the present invention, it is preferable that the fine adjustment phase interpolator circuit 112 precedes the coarse adjusting variable delay circuit 114. In particular, if the fine tuning phase interpolator circuit 112 is located after the coarse tuning variable delay circuit 114, it is possible that an edge of the output clock signal 115 could receive a coarse update without a corresponding fine update, or vice versa. This could result in a large jitter or duty cycle change in the output clock signal 115, depending on which clock signal edge is affected. Although this could be avoided by requiring that no more than one clock signal edge is in the variable delay circuit 114 at any given time, this could limit the total delay through the DLL circuit 100 to within around one clock signal period. By placing the fine tuning stage before the coarse tuning stage, however, it can be ensured that each clock edge has corresponding fine and coarse tuning updates, which can allow the delay through the DLL circuit 100 to substantially exceed one clock cycle without the jitter/duty cycle phenomenon described above.

Figure 2:
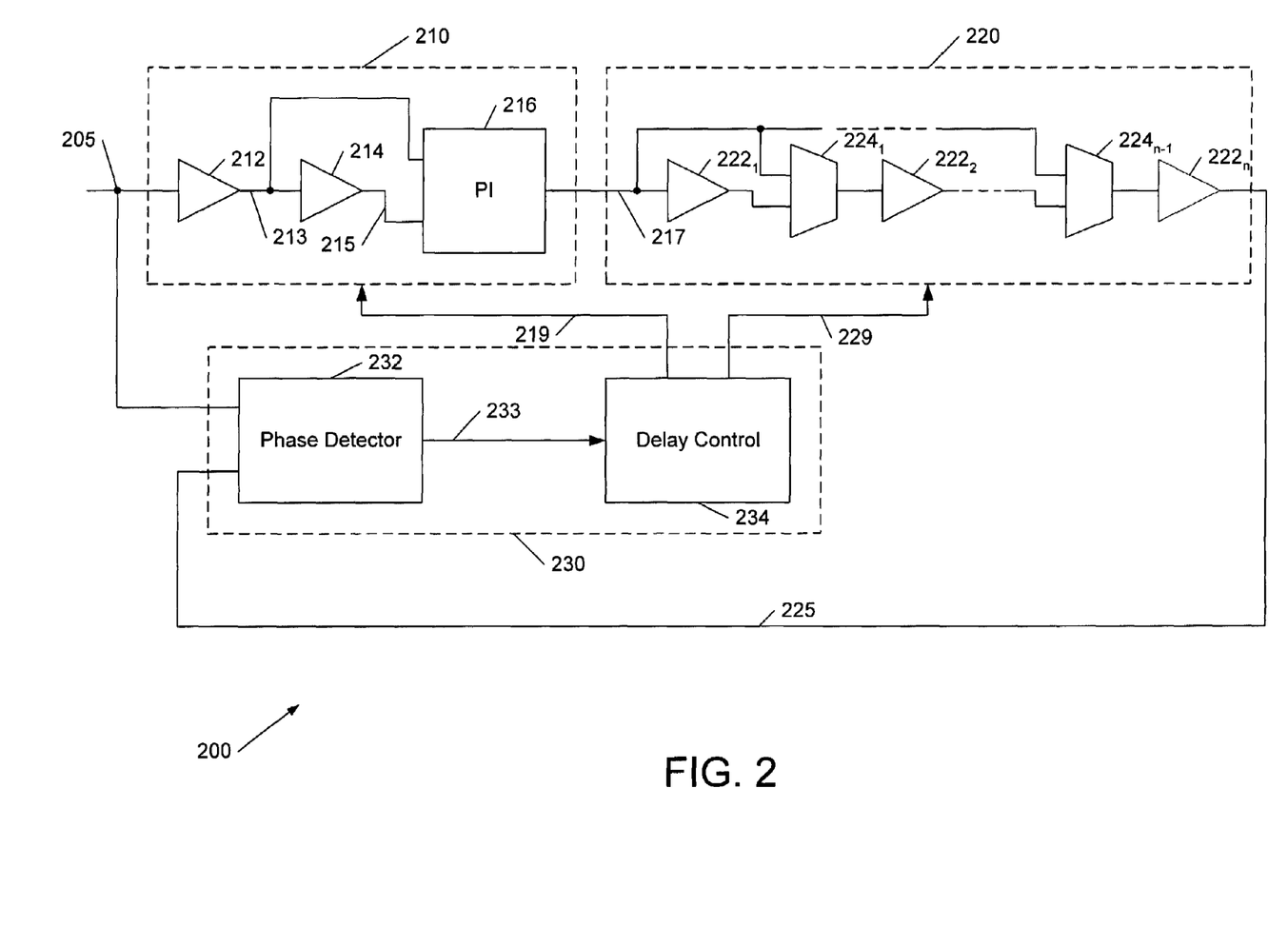
FIG. 2 is a schematic diagram of a DLL circuit according to further embodiments of the present invention.

FIG. 2 illustrates a DLL circuit 200 according to further embodiments of the present invention. The DLL circuit 200 includes a phase interpolator circuit 210 including first and second cascaded delay circuits 212, 214 that generate first and second delayed clock signals 213, 215 from a reference clock signal 205. The phase interpolator circuit 210 further includes a phase interpolator 216 that receives the first and second delayed clock signals 213, 215 and that generates a phase interpolated clock signal 217 that is phase interpolated between the first and second clock delayed signals 213, 215. The phase interpolation is governed by a first control signal 219 generated by a phase control circuit 230.

The DLL circuit 200 further includes a variable delay circuit in the form of a tapped delay chain circuit 220 that receives the phase interpolated clock signal 217 and that generates an output clock signal 225 therefrom that is variably delay responsive to a second control signal 229. As shown, the tapped delay chain circuit 220 includes a plurality of fixed delay circuits $222_1$–$222_n$ that are interconnected by a switching circuit that is operative to selectively bypass selected ones of the fixed delay circuits $222_1$–$222_n$. In particular, the switching circuit includes multiplexers $224_1$–$224_{n-1}$ that are operative to selectively bypass selected ones of the fixed delay circuits $222_1$–$222_n$ responsive to the second control signal 229 generated by the phase control circuit 230. It will be appreciated that the second control signal 229 may comprise, for example, a count signal such as that generated by the coarse control counter circuit 428 described below with reference to FIG. 4.

As further shown in FIG. 2, the phase control circuit 230 includes a phase detector circuit 232 that generates an error signal 233 responsive to a comparison of the reference clock signal 205 and the output clock signal 225. The phase control circuit 230 further includes a delay control circuit 234 that generates the first and second control signals 219, 229 responsive to the error signal 233.

It will be appreciated that various components of the DLL circuit 200 can be implemented in a number of different ways. For example, the phase interpolator 216 may comprise an analog or digital phase interpolator. The control signals 219, 229 may be analog or digital control signals. The delay control circuit 234 may include filtering/hysteresis circuitry. The phase interpolator circuit 210 and the tapped delay chain circuit 220 may be arranged in reverse order to that shown in FIG. 2, i.e., the tapped delay chain circuit 220 may be precede the phase interpolator circuit 210 in the forward portion of the DLL loop.

Figure 3:
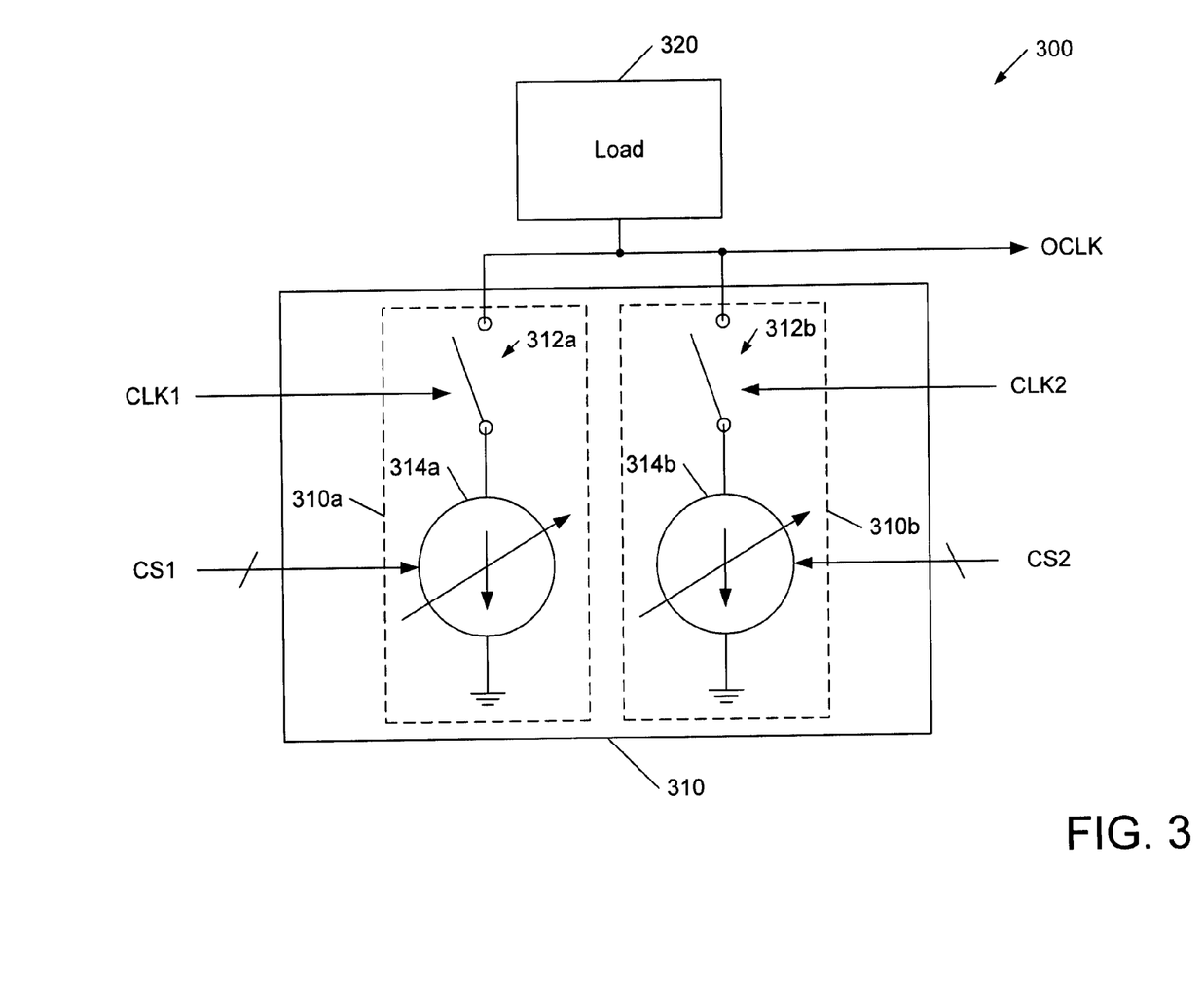
FIG. 3 is a schematic diagram illustrating a phase interpolator according to some embodiments of the present invention.

FIG. 3 illustrates an exemplary analog phase interpolator 300 that may be used with the present invention. The phase interpolator 300 includes a mixer circuit 310 including first and second branches 310a, 310b that are coupled to a load 320. The respective branches 310a, 310b include respective switches 312a, 312b that operate responsive to respective ones of first and second clock signals CLK1, CLK2 that define the range for phase interpolation (e.g., clock signals corresponding to the clock signals 213, 215 of FIG. 2). The branches 310a, 310b also include respective variable current sources 314a, 314b that are controlled by digital control signals CS1, CS2 that set tail currents and the amount of mixing by the mixer circuit 310 to control the phase of an output clock signal OLCK. For example, the control signals CS1, CS2 may be derived from a count signal generated by a counter-based control circuit, such as the fine control counter circuit 424 described below with reference to FIG. 4.

Figure 4:
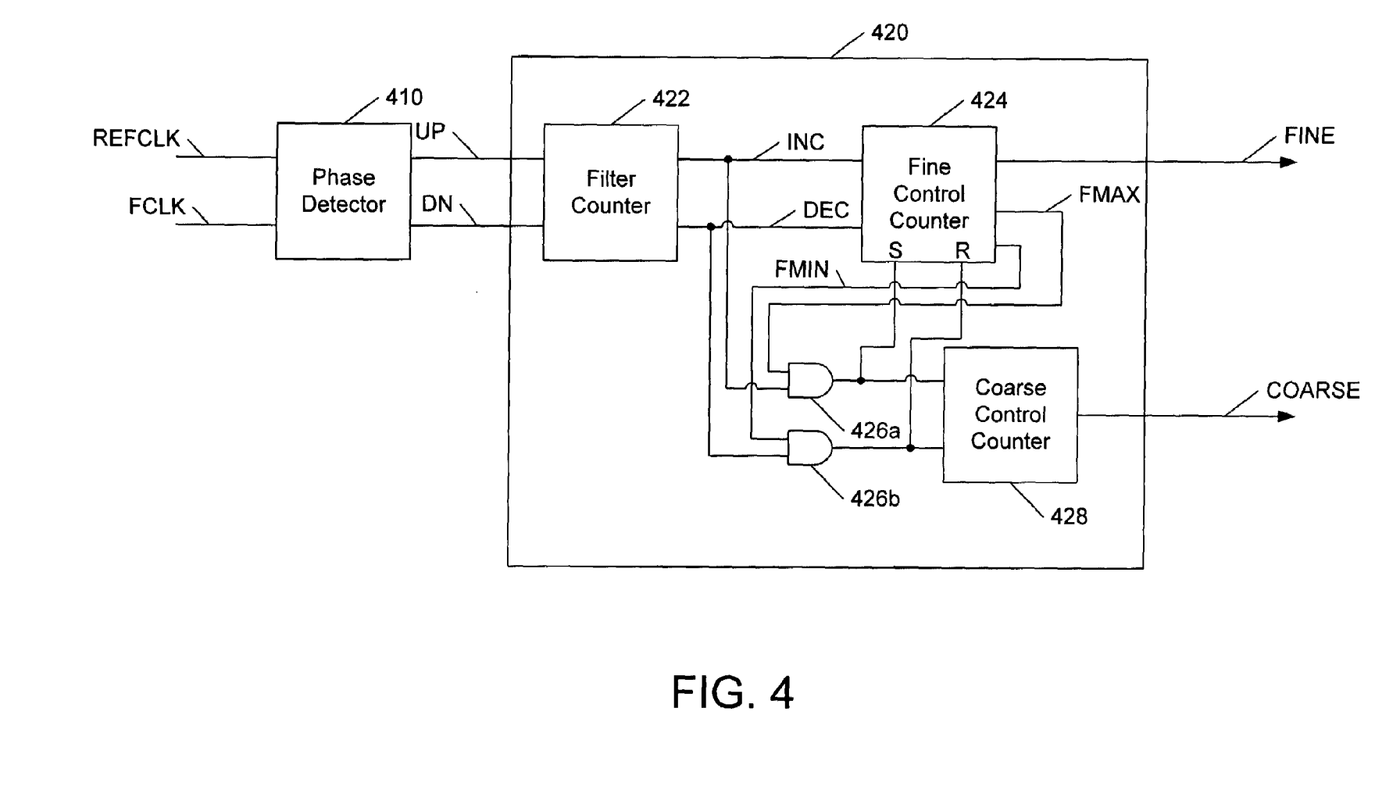
FIG. 4 is a schematic diagram illustrating a delay control circuit according to further embodiments of the present invention.

FIG. 4 illustrates an exemplary control circuit 400 according to some embodiments of the present invention. The control circuit 400 includes a phase detector circuit 410 configured to generate error signals UP, DN responsive to comparison of a reference clock signal REFCLK and a feedback clock signal FCLK (e.g., the output clock signals 115 of FIG. 1 or the output clock signal 225 of FIG. 2). The control circuit 400 further includes a delay control circuit 420 that receives error signals UP, DN from the phase detector circuit 410. As shown, the delay control circuit 420 includes a filter counter circuit 422 that counts up or down responsive to the error signals UP, DN, thus producing filtered counter command signals INC, DEC. The delay control circuit 420 also includes a fine control counter circuit 424 and a coarse control counter circuit 428 that generate fine and coarse control count signals FINE, COARSE that may be used to control fine and coarse delay control elements in a DLL responsive to the filtered counter command signals INC, DEC.

In particular, the counter command signals INC, DEC are used to increment/decrement the fine control counter circuit 424 and the coarse control counter circuit 428. The fine control counter circuit 424 generates the fine control count signal FINE, which may be used to control a phase interpolator, such as the phase interpolator 300 of FIG. 3. The fine control counter circuit 424 also generates fine control count limit indicator signals FMAX, FMIN that indicate when the fine control count signal FINE has reached respective maximum and minimum values.

The coarse control counter circuit 428 increments/decrements the coarse control count signal COARSE (e.g., a signal that may be used to control a coarse delay circuit, such as the tapped delay chain circuit 220 of FIG. 2) responsive to the counter command signals INC, DEC subject the fine control count limit indicator signals FMIN, FMAX. In particular, AND gates 426a, 426b logically combine the counter command signals INC, DEC and the fine control count limit indicator signals FMIN, FMAX such that the coarse control counter circuit 428 is not enabled (does not increment/decrement) unless the corresponding one of the fine control count limit indicator signals FMAX, FMIN is also asserted. The meeting of such logical conditions may also cause a corresponding setting/resetting of the fine control counter circuit 424, i.e., by the application of the outputs of the AND gates 426a, 426b to set and reset S, R inputs of the fine control counter circuit 424, such that the fine control count signal FINE moves between extremes of its delay range in concert with the incrementing/decrementing of the coarse control counter circuit 428.

More particularly, when the fine control count signal FINE and the coarse count control signal COARSE are applied in a DLL circuit, such as the DLL circuit 200 of FIG. 2, to control fine and coarse delay adjustment, respectively, the coarse control count signal COARSE does not change, e.g., cause a step increase/decrease in delay through tapped delay chain circuit 220, until the fine control count signal FINE has hit a limit, corresponding to a boundary of the range of fine delay control afforded by the phase interpolator. When such a step change does occur, the fine control count signal FINE preferably is shifted in a complementary fashion to limit overcompensation, with the range of delay provided by the fine control count signal FINE preferably being substantially the same as the delay resolution provided by the coarse control count signal COARSE. Oscillation between delay step changes produced by the coarse control count signal COARSE can be damped by the action (hysteresis) provided by the filter counter circuit 422. In this manner, a smooth interaction of fine and coarse delay adjustment can be achieved.

In the drawings and specification, there have been disclosed exemplary embodiments of the invention. Although specific terms are employed, they are used in a generic and descriptive sense only and not for purposes of limitation, the scope of the invention being defined by the following claims.

The invention claimed is:

1. A delay-locked loop (DLL) circuit, comprising:
 a phase interpolator circuit that receives a reference clock signal and generates a finely variably delayed clock signal therefrom responsive to a first control signal;
 a variable delay circuit that receives the finely variably delayed clock signal and generates a coarsely variably delayed output clock signal therefrom responsive to a second control signal; and
 a phase control circuit that generates the first and second control signals responsive to the output clock signal and the reference clock signal, the phase control circuit comprising:
  a phase detector that generates an error signal responsive to a comparison of the reference clock signal to the output clock signal; and
  a delay control circuit that generates the first and second control signals responsive to the error signal, the delay control circuit comprising:
   a fine control counter circuit that increments and decrements a fine control count signal responsive to the error signal and that generates a count limit indicator signal responsive to the fine control count signal reaching one of a maximum or minimum count; and
   a coarse control counter circuit that increments and decrements a coarse control count signal responsive to the error signal subject to the count limit indicator signal,
  wherein the phase interpolator circuit is responsive to the fine control count signal; and
  wherein the variable delay circuit is responsive to the coarse control count signal.

2. A DLL circuit according to claim 1, wherein the variable delay circuit is configured to provide step changes in delay responsive to the second control signal.

3. A DLL circuit according to claim 2, wherein the variable delay circuit comprises a tapped delay chain circuit comprising a plurality of delay circuits interconnected by a switching circuit that is operative to selectively bypass one or more of the delay circuits responsive to the second control signal.

4. A DLL circuit according to claim 1, wherein the phase control circuit is operative to cause the phase interpolator circuit to shift from one extreme of a delay range thereof towards another extreme of the delay range concurrent with a step change in delay through the variable delay circuit.

5. A DLL circuit according to claim 1, wherein the phase interpolator circuit comprises:
 first and second delay circuits coupled in series and configured to generate respective first and second delayed clock signals; and
 a phase interpolator that receives the first and second delayed clock circuits and that generates the finely variably delayed clock signal therefrom.

6. A DLL circuit according to claim 5, wherein the phase interpolator comprises one of an analog phase interpolator or a digital phase interpolator.

7. A DLL circuit according to claim 1, wherein the coarse control counter circuit is enabled to count responsive to assertion of the count limit indicator signal.

8. A DLL circuit according to claim 1, wherein the error signal comprises first and second error signals, wherein the fine control counter circuit increments and decrements responsive to respective ones of the first and second error signals, and wherein the coarse control counter circuit increments and decrements responsive to respective ones of the first and second error signals.

9. A DLL circuit according to claim 1, wherein the phase interpolator circuit comprises:
 a delay circuit that receives the reference clock signal; and
 a phase interpolator that interpolates between an input and an output of a delay of the delay circuit responsive to the first control signal to produce the finely variably delayed clock signal.

10. A DLL circuit, comprising:
 a phase interpolator circuit comprising:
  a delay circuit configured to receive a reference clock signal; and a phase interpolator that interpolates between an input and an output of a delay of the delay circuit responsive to the control input to produce a phase interpolated clock signal;

a tapped delay chain circuit configured to receive the phase interpolated clock signal and to generate an output clock signal therefrom that is variably delayed responsive to the control input; and a phase control circuit that generates the control input responsive to a comparison of the output clock signal to the reference clock signal, the phase control circuit comprising:

a phase detector circuit that generates that generates an error signal responsive to a comparison of the reference clock signal to the output clock signal; and a delay control circuit that generates first and second control signals responsive to the error signal, the delay control circuit comprising:

a fine control counter circuit that increments and decrements a fine control count signal responsive to the error signal and that generates respective minimum and maximum count limit indicator signals responsive to the fine control count signal reaching respective ones of maximum and minimum counts; and a coarse control counter circuit that increments and decrements a coarse control count signal responsive to the error signal subject to the maximum and minimum count limit indicator signals;

wherein the phase interpolator circuit is responsive to the fine control count signal; and wherein the tapped delay chain circuit is responsive to the coarse control count signal.

11. A DLL circuit according to claim 10, wherein the phase interpolator circuit is configured to provide a fine delay adjustment and wherein the tapped delay chain is configured to provide a coarse delay adjustment.

12. A DLL circuit according to claim 10, wherein the tapped delay chain circuit comprises a cascade of selectively bypassable fixed delay circuits.

13. A DLL circuit according to claim 10, wherein a delay resolution of the tapped delay chain circuit is substantially the same as a delay range of the phase interpolator circuit.

14. A DLL circuit according to claim 10, wherein the phase control circuit is operative to cause the phase interpolator circuit to shift from one extreme of a delay range thereof towards another extreme of the delay range concurrent with a step change in delay through the tapped delay chain circuit.

15. A DLL circuit according to claim 10, wherein the phase interpolator circuit comprises:

the delay circuit comprises a cascaded first and second delay circuits that generate respective first and second delayed clock signals; and wherein the phase interpolator receives the first and second delayed clock signals and generates the phase interpolated clock signal therefrom.

16. A DLL circuit according to claim 15, wherein the phase interpolator comprises one of an analog phase interpolator or a digital phase interpolator.

17. A DLL circuit according to claim 10, wherein the coarse control counter circuit is enabled responsive to assertion of one of the maximum and minimum count limit indicator signals.

18. A DLL circuit according to claim 10, wherein the error signal comprises first and second error signals, wherein the fine control counter circuit increments and decrements responsive to respective ones of the first and second error signals, and wherein the coarse control counter circuit increments and decrements responsive to respective ones of the first and second error signals.

* * * * *

UNITED STATES PATENT AND TRADEMARK OFFICE
CERTIFICATE OF CORRECTION

| | |
|---|---|
| PATENT NO. | : 7,046,058 B1 |
| APPLICATION NO. | : 10/671305 |
| DATED | : May 16, 2006 |
| INVENTOR(S) | : Al Fang et al. |

It is certified that error appears in the above-identified patent and that said Letters Patent is hereby corrected as shown below:

Column 7, line 13, delete the second occurrence of "that generates"

Signed and Sealed this

Fifteenth Day of August, 2006

JON W. DUDAS
*Director of the United States Patent and Trademark Office*